(12) United States Patent
Liu

(10) Patent No.: US 8,168,513 B2
(45) Date of Patent: May 1, 2012

(54) METHOD FOR FABRICATING PACKAGING SUBSTRATE

(75) Inventor: Chin-Ming Liu, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 179 days.

(21) Appl. No.: 12/780,439

(22) Filed: May 14, 2010

(65) Prior Publication Data

US 2010/0314037 A1    Dec. 16, 2010

(30) Foreign Application Priority Data

Jun. 11, 2009    (TW) ................................ 98119494 A

(51) Int. Cl.
*H01L 21/336* (2006.01)
(52) U.S. Cl. .......... 438/458; 438/455; 438/406; 156/50; 156/239
(58) Field of Classification Search .................. 438/458, 438/977, 455, 406, 30; 156/50, 239, 247
See application file for complete search history.

(56) References Cited

U.S. PATENT DOCUMENTS

| 7,351,300 B2 * | 4/2008 | Takayama et al. ............ 156/239 |
| 2008/0202661 A1 * | 8/2008 | Kobayashi ...................... 156/50 |
| 2010/0314037 A1 * | 12/2010 | Liu ............................... 156/248 |

* cited by examiner

*Primary Examiner* — Fernando L. Toledo
*Assistant Examiner* — Mark A Laurenzi
(74) *Attorney, Agent, or Firm* — Peter F. Corless; Steven M. Jensen; Edwards Wildman Palmer LLP

(57) ABSTRACT

A method for fabricating a packaging substrate includes: providing a base having a release film with two opposite surfaces, two first auxiliary dielectric layers enclosing the release film, and two metal layers disposed on the two first auxiliary dielectric layers, therewith an effective area defined on the two metal layers; forming an inner wiring layer from the two metal layers; forming on each of the two first auxiliary dielectric layers and the inner wiring layers a built-up structure having first conductive pads so as for two initial substrates to be formed on the opposite surfaces of the release film; removing whatever is otherwise lying outside the effective area; removing the release film; and forming dielectric layer openings in the two first auxiliary dielectric layers so as for two substrate bodies to be formed from the initial substrates, wherein a portion of the inner wiring layers are exposed to thereby function as second conductive pads.

17 Claims, 10 Drawing Sheets

METHOD FOR FABRICATING PACKAGING SUBSTRATE

CROSS-REFERENCES TO RELATED APPLICATIONS

This application claims under 35 U.S.C. §119(a) the benefit of Taiwanese Application No. 098119494 filed Jun. 11, 2009 the entire contents of which is incorporated herein by reference.

BACKGROUND OF THE INVENTION

1. Field of the Invention

The present invention relates to methods for fabricating packaging substrates, and more particularly, to a method for fabricating packaging substrates for avoiding a waste of materials resulting from discarding a temporary carrier during the fabricating process of packaging substrates.

2. Description of Related Art

Electronic products are increasingly multifunction and high-performance devices. In order to fulfill the packaging requirements for a high degree of integration and miniaturization of semiconductor packages such that more active/inactive components and circuit connections can be provided, the semiconductor packaging substrate has evolved from a double-layer board to a multi-layer board to increase available wiring layout area in the semiconductor packaging substrate by using interlayer connection techniques in a limited space, such that the requirement for a high-density integrated circuit can be accommodated, while lowering the thickness of the packaging substrate to achieve the goal of making the package unit light in weight, physically small, and with increased electrical functionality.

In the prior art, a multi-layer board is comprised of a core plate and wiring built-up structures formed on both sides thereof. However, using the core plate results in increasing the conducting trace length and overall thickness of the structure, which makes it very hard to accommodate the requirement of compact size while increasing the functionality for an electronic product.

As such, a coreless board structure has been developed in order to decrease the conducting trace length and to lower the overall structural thickness, and to accommodate the trend of compact, dense, high-frequency products. FIGS. 1A to 1F show cross-sectional views of a packaging substrate and a fabrication method thereof in a prior art.

Referring to FIG. 1A, a carrier plate 10 has two opposite sides, on which respectively two thin-film metal layers 11, two release films 12, and two carrier metal layers 13 are disposed in sequence.

Referring to FIG. 1B, a first dielectric layer 14 is formed on the carrier metal layers 13.

Referring to FIG. 1C, a plurality of vias 140 are formed in the first dielectric layers 14 by photolithography or laser ablation, and subsequently a plurality of depressions 130 are formed on the surfaces of the carrier metal layers 13 exposed by the vias 140.

Referring to FIG. 1D, solder bumps 141a and first conductive vias 141b are formed in sequence in the depressions 130 and the corresponding vias 140, and first wiring layers 142 are formed on the first dielectric layers 14, the first wiring layers 142 electrically connecting with the first conductive vias 141b. Subsequently, two built-up structures 15 are formed on the first dielectric layers 14 and the first wiring layers 142, each built-up structures 15 being comprised of at least one second dielectric layer 151, a second wiring layer 152 disposed on the second dielectric layer 151, and a plurality of second conductive vias 153 disposed in the second dielectric layers 151 and electrically connecting the first wiring layer 142 and the second wiring layer 152. The outmost second wiring layers 152 of the built-up structures 15 further have a plurality of conductive pads 154. Insulating protective layers 16 are formed on the outmost layers of the built-up structures 15. The insulating protective layers 16 have a plurality of insulating protective layer openings 160 formed therein from which the conductive pads 154 are exposed, respectively.

Referring to FIG. 1E, the carrier metal layers 13 are separated by the release films 12 to obtain two initial packaging substrates 1 separated from the carrier plate 10.

Referring to FIG. 1F, the carrier metal layer 13 is removed to form a plurality of solder bumps 141a protruding from the surface of the first dielectric layer 14 to obtain a packaging substrate, such that the solder bumps 141a can provide for subsequently mounting the semiconductor chip (not shown).

As mentioned above, in the prior art method for fabricating a packaging substrate, a release film 12 is formed on the both sides of the carrier plate 10, respectively, wherein thin-film metal layers 11 are sandwiched between each release film 12 and the carrier plate 10; then built-up structures 15 are formed on the thin-film metal layers 11 of both sides of the aforementioned structure; and, finally, two packaging substrates are formed by separating the built-up structures on both sides along the interface of the release film 12 and the carrier metal layer 13.

However, in the prior art fabrication method, the thin-film metal layer 11 and the release film 12 have to be additionally formed on the both sides of the carrier plate 10 for temporarily supporting the structures on the both sides and providing for separation, and, in the end, the temporary carrier (including carrier plate 10, two thin-film metal layers 11 and two release films 12) will be discarded, which results in process complexity, material waste and increased manufacturing costs.

Therefore, in view of the above-described problems, it is highly desirable to find a way to avoid problems in the prior art such as discarding the temporary carrier that results in the material waste and process complexity and the like for manufacturing a packaging substrate.

SUMMARY OF THE INVENTION

In view of the above drawbacks of the prior art, the present invention provides a method for fabricating a packaging substrate advantageously characterized by saving of material costs.

To achieve the above-described objectives and other objectives, the present invention discloses a method for fabricating a packaging substrate including the steps of: providing a base including a release film having two opposite surfaces, two first auxiliary dielectric layers correspondingly disposed on the opposite surfaces of the release film and enclosing the release film, and two metal layers disposed on the two first auxiliary dielectric layers, respectively, therewith an effective area defined on each of the two metal layers; forming an inner wiring layer on each of the two metal layers; forming on each of the two first auxiliary dielectric layers and the inner wiring layers a built-up structure, of which the outmost surface having a plurality of first conductive pads, so as for two initial substrates to be formed on the two opposite surfaces of the release film; removing whatever is otherwise lying outside the effective area; removing the release film; and forming a plurality of dielectric layer openings in the two first auxiliary dielectric layers so as to form two substrate bodies from the initial substrates, wherein a portion of the inner wiring layers correspond in position to and are exposed from the dielectric layer openings, respectively, thereby to function as second conductive pads.

In the above fabrication method, the method for fabricating the base comprises: providing the release film; disposing the first auxiliary dielectric layers and the metal layers on two said opposite surfaces of the release film in sequence, wherein the area of each of the first auxiliary dielectric layers is larger than the area of the release film, and the area of each of the metal layers is larger than the area of the first auxiliary dielectric layer; and laminating the metal layers, the first auxiliary dielectric layers, and the release film altogether.

In the above fabrication method, the built-up structure has at least one dielectric layer, a wiring layer disposed on the dielectric layer, and one or more conductive via disposed in the dielectric layer and electrically connecting the wiring layer and the inner wiring layer, and the outermost wiring layer electrically connects with the first conductive pad.

In the above-described fabrication method, the removal of whatever lies outside the effective area is preformed by cutting.

The above-described fabrication method further comprises forming an insulating protective layer on the built-up structure, the insulating protective layer having a plurality of insulating protective layer openings formed therein such that the first conductive pads are exposed from the insulating protective layer openings, respectively.

In addition, the above-described fabrication method further comprises forming a surface treatment layer on the first conductive pad and the second conductive pad.

The present invention further provides a method for fabricating a packaging substrate which includes the steps of: providing a base which is comprised of a release film having two opposite surfaces, two first auxiliary dielectric layers correspondingly disposed on the opposite surfaces of the release film and enclosing the release film, and two core plates formed on the two first auxiliary dielectric layers, respectively, each of the core plates having opposite first and second surfaces, inner-layer conductive traces disposed on the first and second surfaces, wherein the second surface of each of the core plates is coupled to the first auxiliary dielectric layer, and effective areas are defined on the first surfaces of each of the core plates; forming a built-up structures on the first surface of each of the core plates such that two initial substrates are formed on the two opposite surfaces of the release film, wherein the outmost surface of each of the built-up structures has a plurality of first conductive pads; removing whatever is otherwise lying outside the effective area; removing the release film; and forming a plurality of dielectric layer openings in the two first auxiliary dielectric layers so as for two substrate bodies to be formed from the initial substrates, wherein a portion of the inner-layer conductive traces on the second surfaces of the core plates correspond in position to and are exposed from the dielectric layer openings, respectively, thereby to function as second conductive pads.

As above-described, the method for fabricating the base includes the steps of: providing the release film; disposing the first auxiliary dielectric layers and the core plates on the two opposite surfaces of the release film in sequence, wherein the area of the first auxiliary dielectric layer is larger than the area of the release film, and the area of each of the core plates is larger than the area of the first auxiliary dielectric layer such that each of the core plates totally covers the first auxiliary dielectric layer; and laminating the core plates, the first auxiliary dielectric layers, and the release film together.

In the above-described fabrication method, the core plate further has a conductive through hole for electrically connecting the inner-layer conductive traces on the first and second surfaces.

In the above-described fabrication method, the built-up structure has at least one dielectric layer, a wiring layer disposed on the dielectric layer, and one or more conductive via disposed in the dielectric layer and electrically connecting the wiring layer and the inner-layer conductive trace, wherein the outmost wiring layer electrically connects with the first conductive pad.

In the above-described fabrication method, removal of whatever is otherwise lying outside the effective area is preformed by cutting.

The above described fabrication method further comprises forming an insulating protective layer on the built-up structure, the insulating protective layer having a plurality of insulating protective layer openings formed therein, such that the first conductive pads are exposed from the insulating protective layer openings, respectively.

The above-described fabrication method further comprises forming a surface treatment layer on the first conductive pads and the second conductive pads.

In the above-described fabrication method, the base further has two second auxiliary dielectric layers disposed on the core plates and two metal layers disposed on the two second auxiliary dielectric layers. In addition, the method for fabricating the base includes the steps of: providing the release film; disposing the first auxiliary dielectric layers, the core plates, the second auxiliary dielectric layers, and the metal layers on two said opposite surfaces of the release film in sequence, wherein the area of each of the first auxiliary dielectric layers is larger than the area of the release film, the area of each of the core plates is larger than the area of the first auxiliary dielectric layer, and the area of each the metal layers is larger than the area of the second auxiliary dielectric layer and the core plate, such that the metal layer totally covers the second auxiliary dielectric layer and the core plate; and laminating the core plates, the metal layers, the first auxiliary dielectric layers, the second auxiliary dielectric layers, and the release film together.

The above-described fabrication method further comprises forming an inner wiring layer from the metal layer such that the built-up structure is disposed on the second auxiliary dielectric layer and the inner wiring layer, wherein the inner wiring layer has one or more inner conductive vias located in the second auxiliary dielectric layer for electrically connecting the inner-layer conductive traces.

In the above-described fabrication method, the built-up structure has at least one dielectric layer, a wiring layer disposed on the dielectric layer, and one or more conductive vias disposed in the dielectric layer and electrically connecting the wiring layer and the inner wiring layer, the first conductive pads electrically connecting with the outmost wiring layer, therewith and an insulating protective layer formed on the built-up structure; and the insulating protective layer has a plurality of insulating protective layer openings such that the first conductive pads are exposed from the insulating protective layer openings, respectively.

The present invention further provides a base for fabricating a coreless or a thin-cored packaging substrate, the base including: a release film having two opposite surfaces; two first auxiliary dielectric layers disposed on the two opposite surfaces of the release film and enclosing the release film; and two metal layers disposed on the two first auxiliary dielectric layers and corresponding in position to the two opposite surfaces of the release film.

The present invention further provides a base for fabricating a coreless or a thin-cored packaging substrate, the base including: a release film having two opposite surfaces; two first auxiliary dielectric layers disposed on the two opposite surfaces of the release film and enclosing the release film; and two core plates disposed on the two first auxiliary dielectric layers and corresponding in position to the two opposite surfaces of the release film.

The thickness of the above-described core plate is less than 0.2 mm, and the core plate has a first surface and an opposite second surface, the second surface is coupled to the first auxiliary dielectric layer, inner-layer conductive traces are disposed on the first and second surfaces, and a conductive through hole is disposed in the core plate for electrically connecting inner conductive traces on the first and second surfaces. The above-described structure further comprises two second auxiliary dielectric layers and two metal layers, the second auxiliary dielectric layers are disposed on the first surfaces of the two core plates, and the two metal layers are disposed on the second auxiliary dielectric layers, respectively.

By the above description, it is understood that the present invention discloses enclosing the release film by the first auxiliary dielectric layers of the base, and subsequently fabricating a wiring structure on each of the first auxiliary dielectric layers, thus two packaging substrates are formed by separating the structures from both sides along the interface of the release film. Compared to the prior art, the present invention uses the first auxiliary dielectric layers to enclose the release film so as to form two initial substrates on the first auxiliary dielectric layers. As such, at the end of fabrication process, it is only necessary to remove and discard the release film, which efficiently avoids the problems of material waste and process complexity otherwise caused by discarding the temporary carrier as is the case in the prior art.

DETAILED DESCRIPTION OF PREFERRED EMBODIMENTS

The following illustrative embodiments are disposed to illustrate the disclosure of the present invention, these and other advantages and effects will be apparent to those skilled in the art after reading this specification.

First Embodiment

FIGS. 2A to 2H are sectional views of a method for fabricating a packaging substrate of the present invention.

Figure 1A:
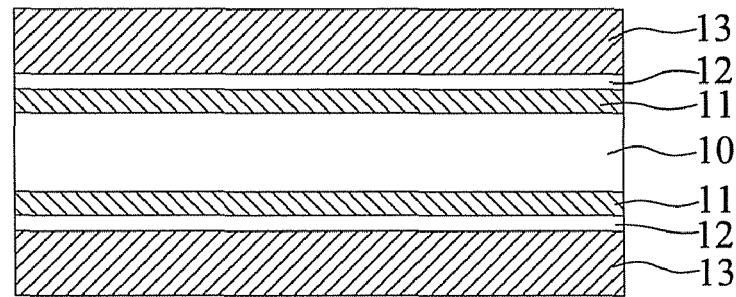
FIGS. 1A to 1F are cross-sectional views showing a conventional method for fabricating a conventional packaging substrate.
Figure 1B:
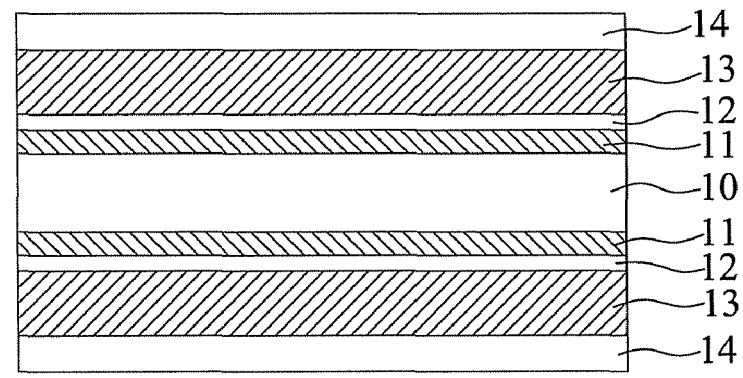
Figure 1C:
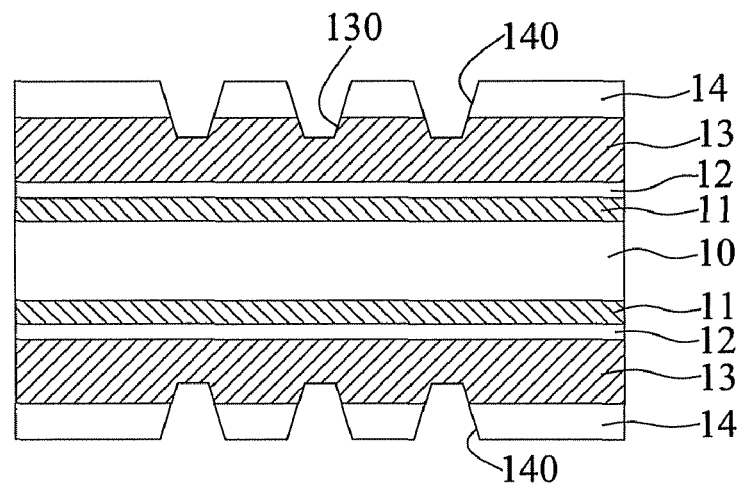
Figure 1D:
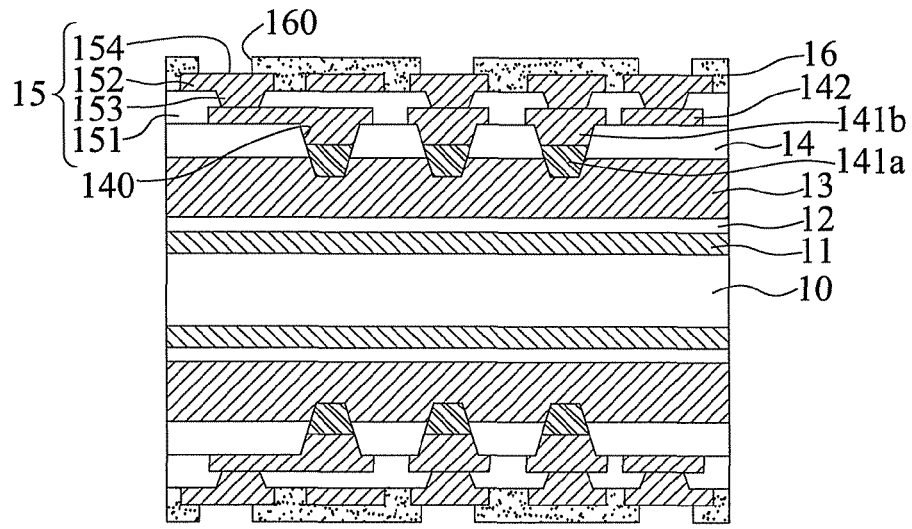
Figure 1E:
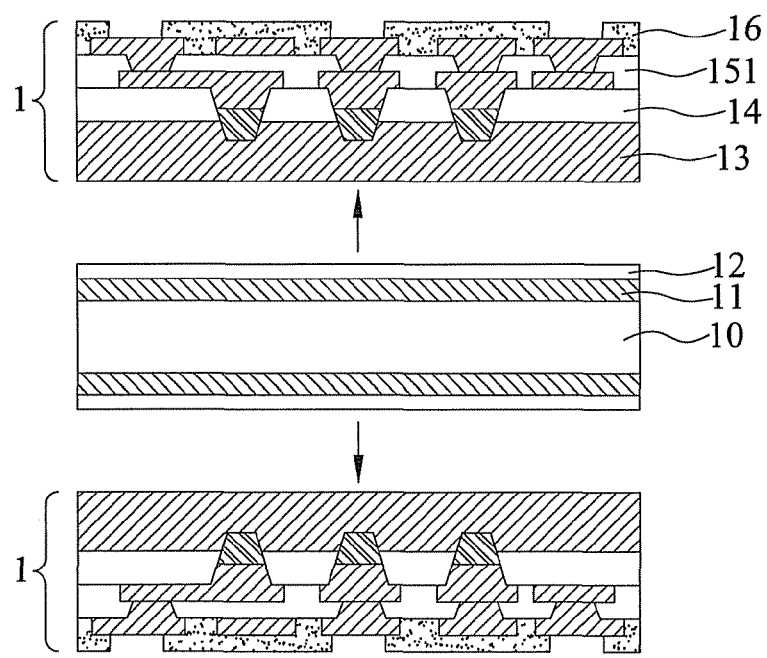
Figure 1F:
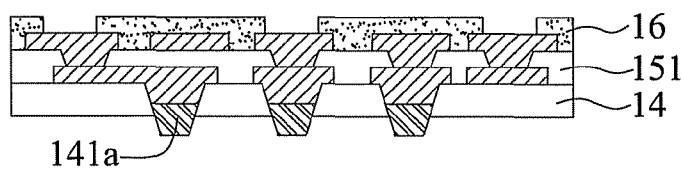
Figure 2A:
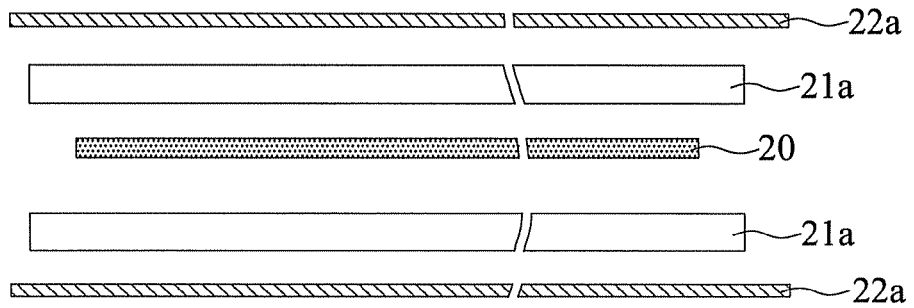
FIGS. 2A to 2H are cross-sectional views showing a method for fabricating a packaging substrate of the present invention.
Figure 2B:
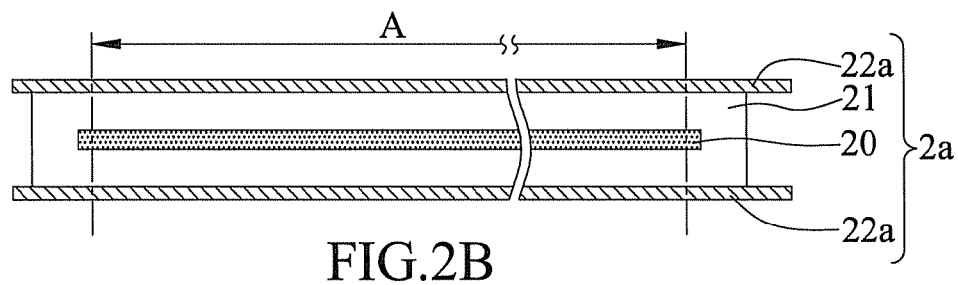

Referring to FIG. 2A and FIG. 2B, a base 2a is provided, and the base 2a comprises: a single release film 20 having two opposite surfaces; two first auxiliary dielectric layers 21a correspondingly disposed on the opposite surfaces of the release film 20 and enclosing the release film 20; and two metal layers 22a disposed on the first auxiliary dielectric layers 21a, corresponding in position to the two opposed surfaces of the release film 20, and therewith an effective area A defined on each of the metal layers 22a.

A method for fabricating the base 2a comprises the steps of: providing a release film 20 having two opposite surfaces; forming two first auxiliary dielectric layers 21a on the two opposite surfaces of the release film 20, respectively, wherein the area of each of the two first auxiliary dielectric layers 21a is larger than the area of the release film 20; and providing two metal layers 22a on the two first auxiliary dielectric layers 21a such that the area of each of the two metal layers 22a is larger than the area of the first auxiliary dielectric layer 21a.

The method for fabricating the base 2a subsequently comprises the step of laminating the two metal layers 22a on the both sides of the release film 20 and the two first auxiliary dielectric layers 21a together, such that the two first auxiliary dielectric layers 21a on the both sides of the release film 20 are combined to form a unitary structure and form a single layer first auxiliary dielectric layer 21 to fully enclose the release film 20, wherein each of the two metal layers 22a totally covers the upper and lower surfaces of the first auxiliary dielectric layer 21, respectively. The method renders it feasible to fabricate the base 2a for use in fabricating a whole-panel packaging substrate of a coreless.

For the description of subsequent processes, in that the processes on the two opposite surfaces of the release film 20 are the same, only one surface of the release film 20 will be illustrated, herein.

Figure 2C:
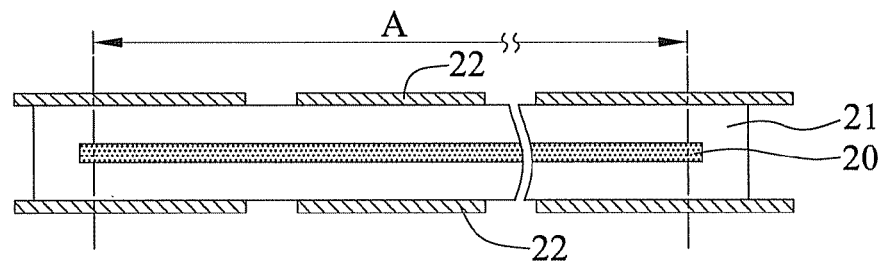

Referring to FIG. 2C, the metal layer 22a (of FIGS. 2A/2B) is patterned to form an inner wiring layer 22. Various techniques for patterning metal material to form conductive traces are known in the art, and, in that such techniques are not a technical feature of the present invention, further description of those techniques is omitted, herein.

Figure 2D:
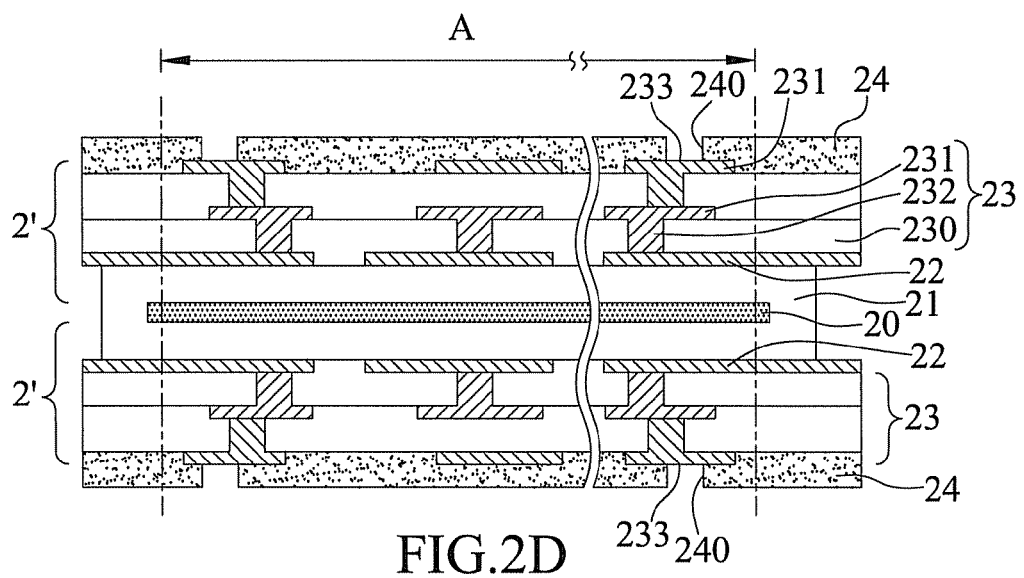

Referring to FIG. 2D, a built-up structure 23 is formed on the inner wiring layer 22 for forming an initial substrate 2' on both opposite surfaces of the release film 20. The built-up structure 23 has at least one dielectric layer 230, a wiring layer 231 disposed on the dielectric layer 230, and a plurality of conductive vias 232 disposed in the dielectric layer 230 and electrically connecting the wiring layer 231 and the inner wiring layer 22. The outmost wiring layer 231 has a plurality of first conductive pads 233.

In this step, an insulating protective layer 24, e.g. anti-soldering material, can be formed on the built-up structures 23 of the initial substrates 2', and a plurality of insulating protective layer openings 240 are formed in the insulating protective layer 24, such that the first conductive pads 233 are exposed from the insulating protective layer openings 240, respectively.

Figure 2E:
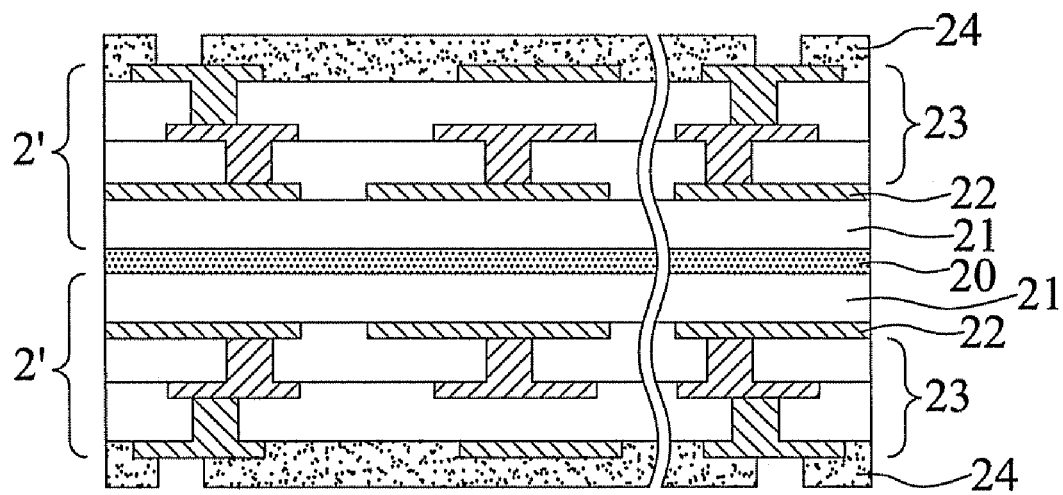
Figure 2F:
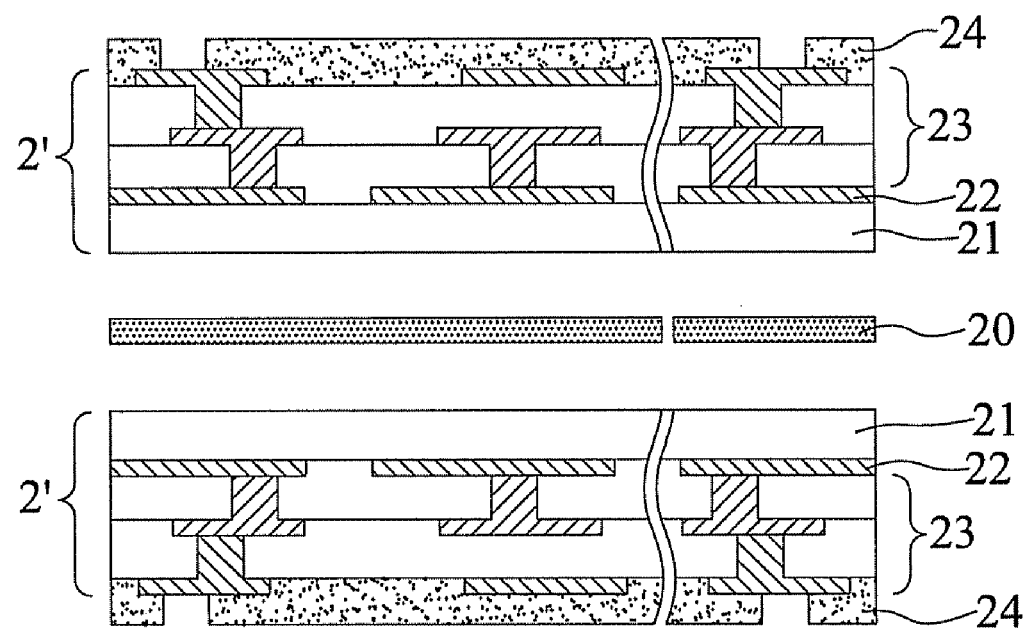

FIGS. 2E and 2F depict separation of the assembly. The structures outside of the effective area A are removed by a cutting method, as shown in FIG. 2E. Further, the release film 20 is removed to separate each of the initial substrates 2' from the release film 20, as shown in FIG. 2F.

Figure 2G:
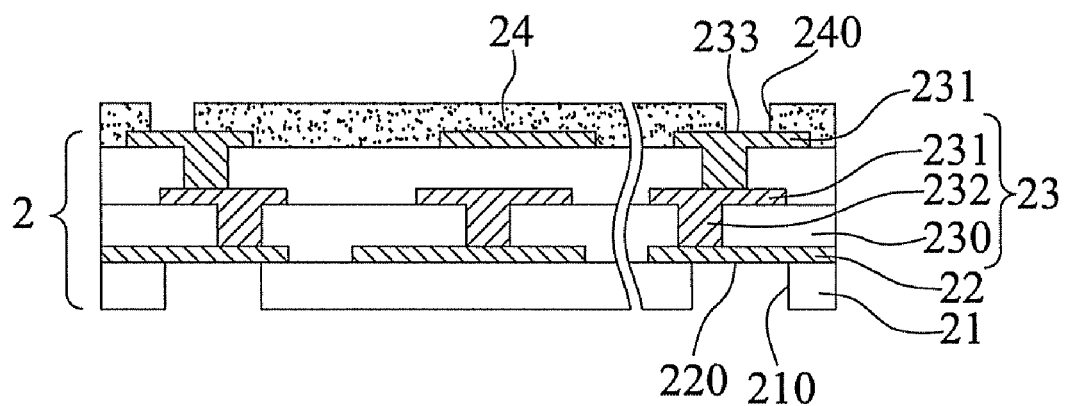

Referring to FIG. 2G, a plurality of dielectric layer openings 210 are formed in the first auxiliary dielectric layer 21 such that a portion of the inner wiring layer 22 is exposed from each of the dielectric layer openings 210 to function as second conductive pads 220, allowing the initial substrate 2' to form a substrate body 2.

Figure 2H:
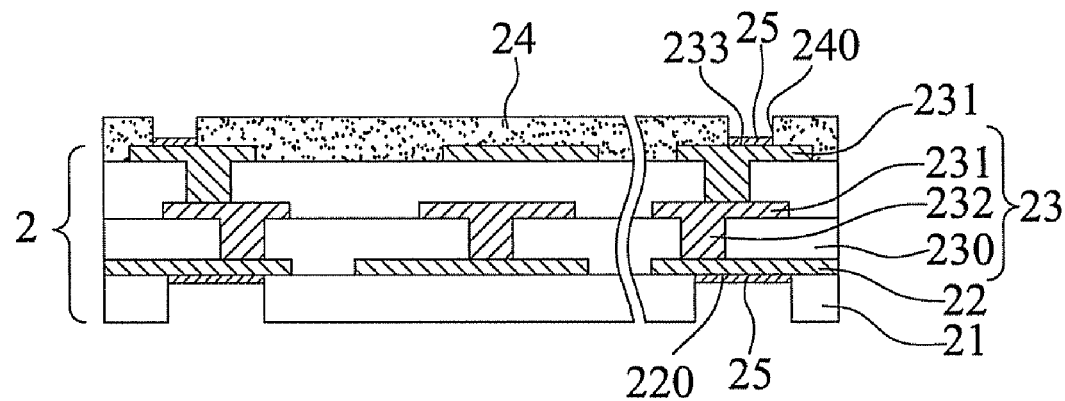

Referring to FIG. 2H, a surface treatment layer 25 is formed on the first and second conductive pads 233, 220 for obtaining a coreless whole-panel packaging substrate; and a plurality of coreless packaging substrate units are disposed on the coreless whole-panel packaging substrate, wherein each coreless packaging substrate unit can be separately obtained by cutting process.

The first auxiliary dielectric layer 21 encloses the release film 20, and the two metal layers 22a become the inner wiring layers 22 by a patterning process. Therefore, in the final stage, only the release film 20 has to be removed and discarded, which efficiently avoids the problems of material waste and process complexity otherwise caused by discarding a temporary carrier as is the case in the prior art.

Second Embodiment

FIGS. 3A to 3G are methods for fabricating a packaging substrate of second embodiment of the present invention. In the second embodiment, the method is applied to a packaging substrate having a thin-core layer, the thin-core layer being a core plate of a thickness less than 0.2 mm. Generally, in that the thickness of a thin-core layer is thin and soft, the edge of the whole-panel packaging substrate is easily warped by chemical liquid, the injection force of a wind knife, or the force of gravity, leaving the substrate vulnerable to damage during transport, or resulting in board jamming and causing the production line to stop. However, a packaging substrate having a thin-core layer can be fabricated by the technique of the present invention. The second embodiment is different from the first embodiment in the structure of the base.

Figure 3A:
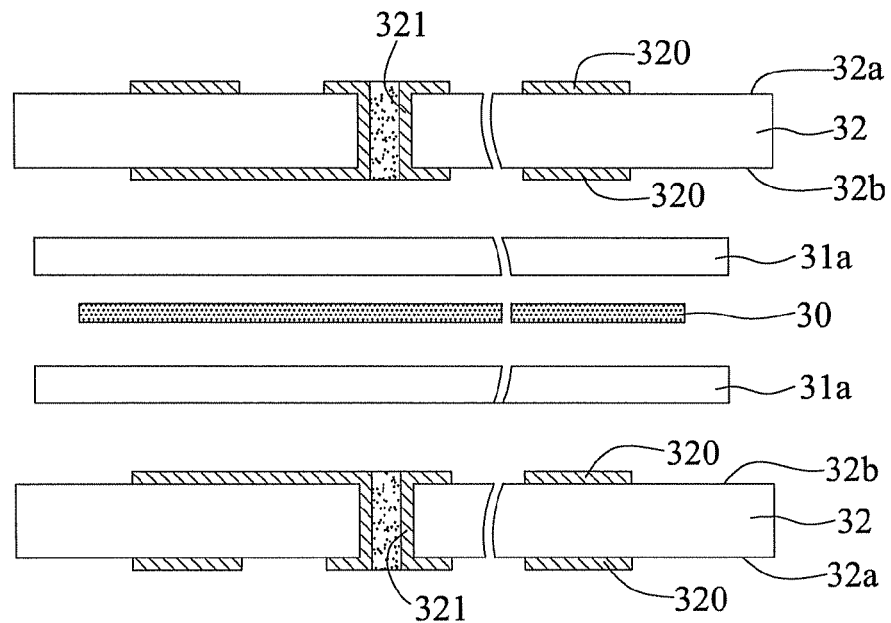
FIGS. 3A to 3G are cross-sectional views showing a method for fabricating a packaging substrate of the present invention.
Figure 3B:
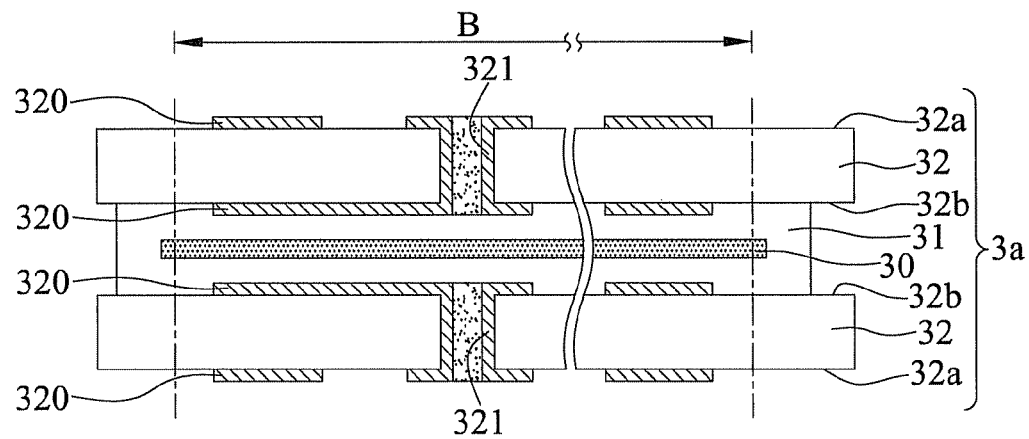

Referring to FIGS. 3A and 3B, a base 3a is provided, and the base 3a comprises: a release film 30 having two opposite surfaces, a first auxiliary dielectric layer 31 disposed on the opposite surfaces of the release film 30 and enclosing the release film 30, and core plates 32 formed on the first auxiliary dielectric layer 31, respectively, wherein an effective area B is defined on each of the core plates 32.

The method of fabricating the base 3a comprises the step of providing a release film 30 having two opposite surfaces and disposing two first auxiliary dielectric layers 31a on the two opposite surfaces of the release film 30, the area of each of the first auxiliary dielectric layers 31a being larger than the area of the release film 30.

Next, providing the two core plates 32 each having a first surface 32a and an opposite second surface 32b, the second surfaces 32b of the two core plates 32 corresponding in position to the two first auxiliary dielectric layers 31a, respectively, wherein the area of each of the core plates 32 is larger than the area of the first auxiliary dielectric layer 31a.

Finally, laminating the core plates 32 and the two first auxiliary dielectric layers 31a on both sides of the release film 30 together, such that the two first auxiliary dielectric layers 31a on the both sides of the release film 30 are combined to form a unitary structure and becoming a single layer first auxiliary dielectric layer 31 enclosing the release film 30, and the second surfaces 32b of the core plates 32 cover the upper and lower surfaces of the first auxiliary dielectric layer 31, respectively, and wherein the effective area B is defined on the first surface 32a of the core plate 32, such that it is feasible to fabricate a base 3a for use in fabricating a whole-panel packaging substrate having a thin-core layer.

The first and second surfaces 32a, 32b of the core plate 32 have inner-layer conductive traces 320 thereon and have conductive through holes 321 in the core plate 32 for electrically connecting the inner-layer conductive traces 320 on the first and second surfaces 32a, 32b.

In the description for subsequent processing, in that the processes for the two surfaces of the release film 30 are the same, only one surface of the release film 30 is described, herein.

Figure 3C:
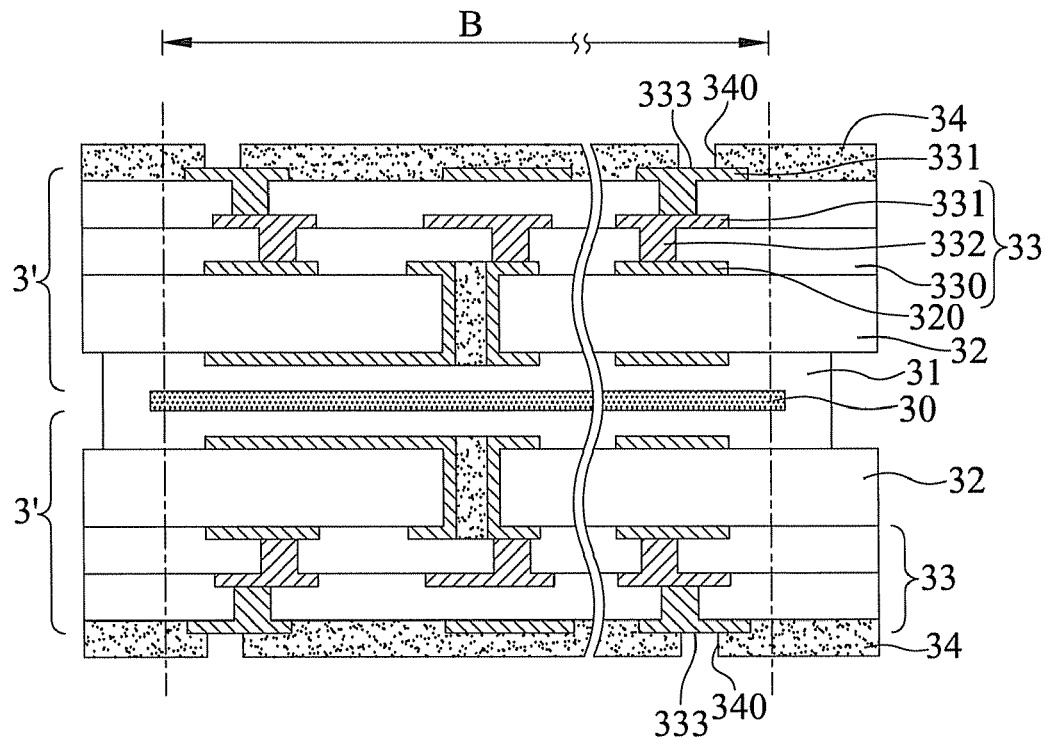

Referring to FIG. 3C, a built-up structure 33 is formed on the first surface 32a and the inner-layer conductive traces 320 of the core plate 32 such that an initial substrate 3' can be formed on the two opposite surfaces of the release film 30, wherein the built-up structure 33 has at least one dielectric layer 330, a wiring layer 331 disposed on the dielectric layer 330, and at least one conductive via 332 disposed in the dielectric layer 330 to electrically connect the wiring layer 331 and the inner-layer conductive traces 320. The outmost wiring layers 331 has a plurality of first conductive pads 333.

Further, an insulating protective layer 34 is formed on the built-up structures 33 of the initial substrates 3', and the insulating protective layer 34 has a plurality of insulating protective layer openings 340 formed therein such that the first conductive pads 333 are exposed from the insulating protective layer openings 340, respectively. However, the insulating protective layer 34 also can be formed in a subsequent process step.

Figure 3D:
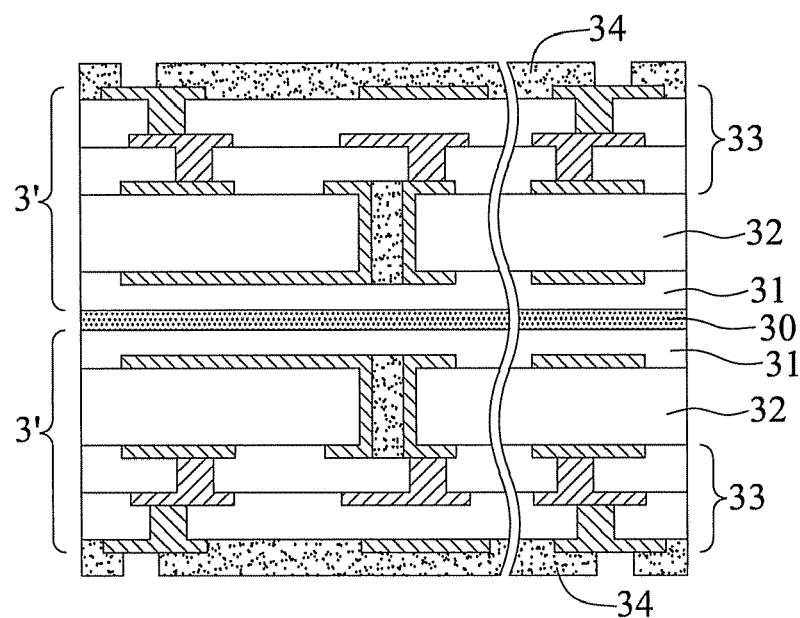
Figure 3E:
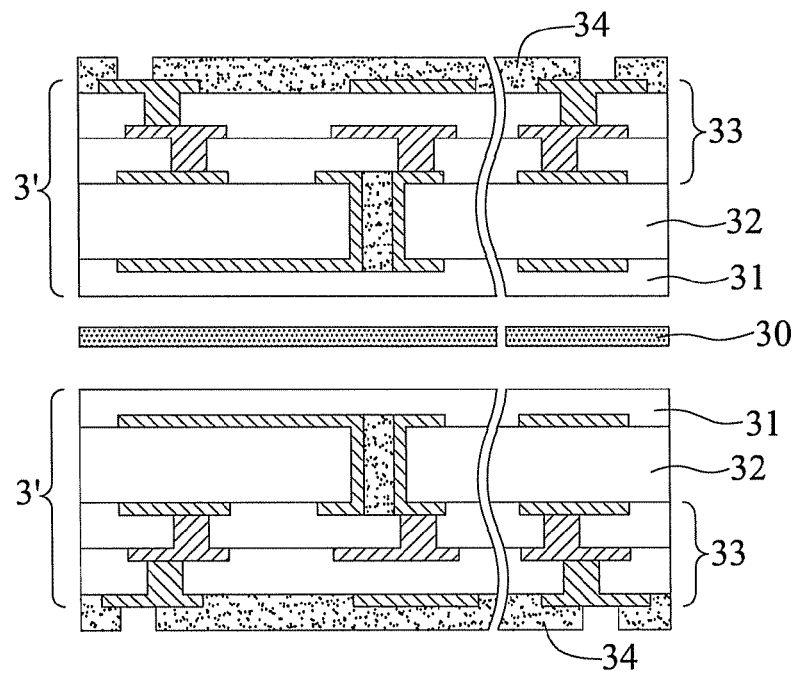

FIGS. 3D and 3E depict the separation of the assembly. The structure lying outside the effective area B is removed by a cutting method, as shown in FIG. 3D, and the release film 30 is removed such that each of the initial substrates 3' is separated from the release film 30, as shown in FIG. 3E.

Figure 3F:
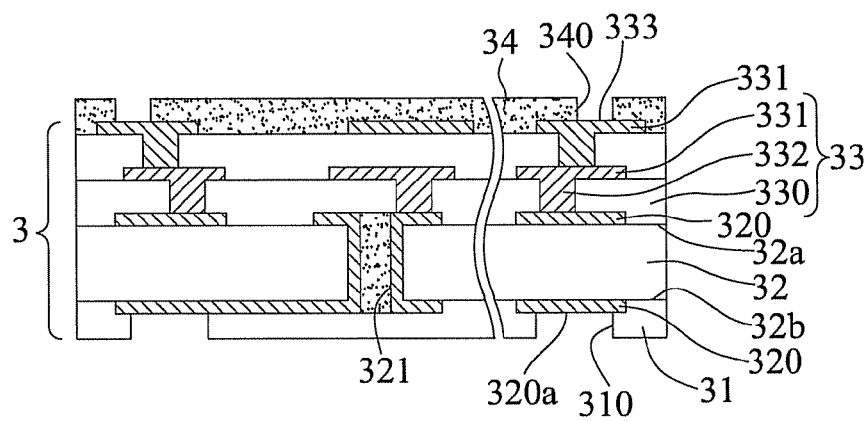
Figure 3G:
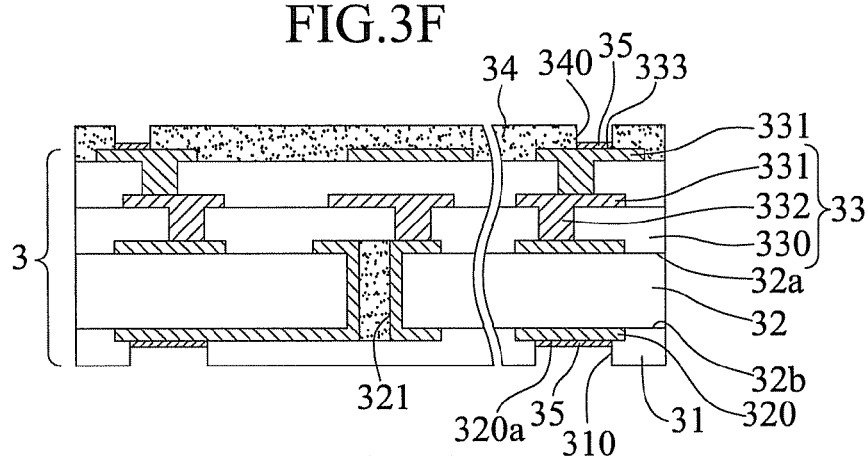

Referring to FIGS. 3F and 3G, a plurality of dielectric layer openings 310 are formed in the first auxiliary dielectric layer 31 such that a portion of the inner-layer conductive traces 320 are correspondingly exposed in each of the dielectric layer openings 310 for functioning as second conductive pads 320a. Thereby, the initial substrate 3' forms a substrate body 3, as shown in FIG. 3F. Further, a surface treatment layer 35 is formed on the first and second conductive pads 333, 320a, such that it is feasible to fabricate a thin-cored whole-panel packaging substrate, as shown in FIG. 3G.

The present invention uses the first auxiliary dielectric layer 31 enclosing the release film 30 such that two core plates 32 are disposed on the two layers (the consolidated first auxiliary dielectric layer 31), such that, towards completion, only the release film 30 has to be removed and discarded in order to effectively avoid the problems of material waste and process complexity resulted from discarding temporary carrier in the prior art.

Third Embodiment

FIGS. 4A to 4E are methods for fabricating a packaging substrate of a third embodiment of the present invention. The third embodiment is different from the preceding embodiments in the structure of the base.

Figure 4A:
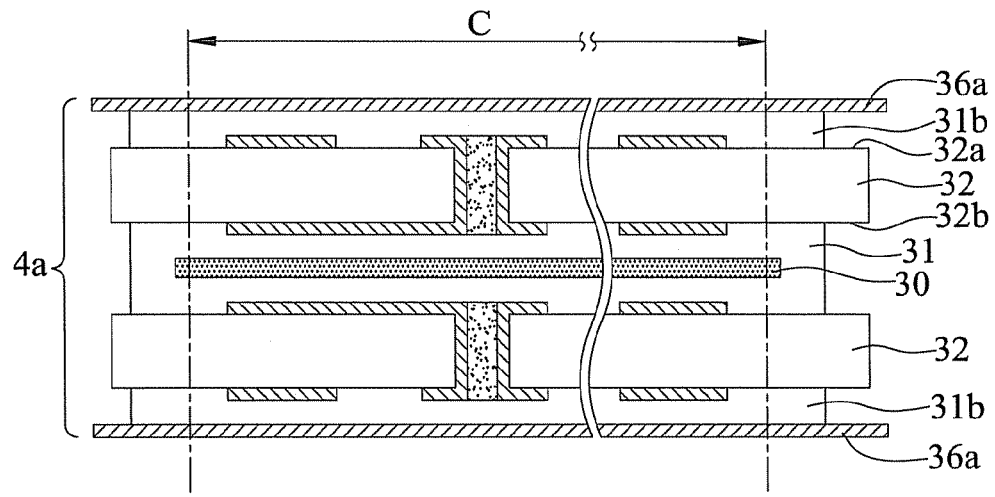
FIGS. 4A to 4E are cross-sectional views showing a method for fabricating a packaging substrate of the present invention.

Referring to FIG. 4A, a base 4a is provided, and the base 4a comprises: a release film 30 having two opposite surfaces, a first auxiliary dielectric layer 31 disposed on the opposite surfaces of the release film 30 and enclosing the release film 30, two core plates 32 oppositely disposed on the first auxiliary dielectric layer 31, two second auxiliary dielectric layers 31b disposed on the first surfaces 32a of the core plates 32, and two metal layers 36a disposed on the two second auxiliary dielectric layers 31b, respectively, wherein an effective area C is defined on each of the metal layers 36a above the core plates 32.

The base 4a is formed in a laminating manner, which can be understood by referring to the above two embodiments, wherein the area of the metal layer 36a is larger than the area of the core plate 32 and the second auxiliary dielectric layer 31b, such that the metal layer 36a totally covers the second auxiliary dielectric layer 31b and the core plate 32. Therefore, it is feasible to fabricate a base 4a for use in fabricating a thin-cored whole-panel packaging substrate.

Figure 4B:
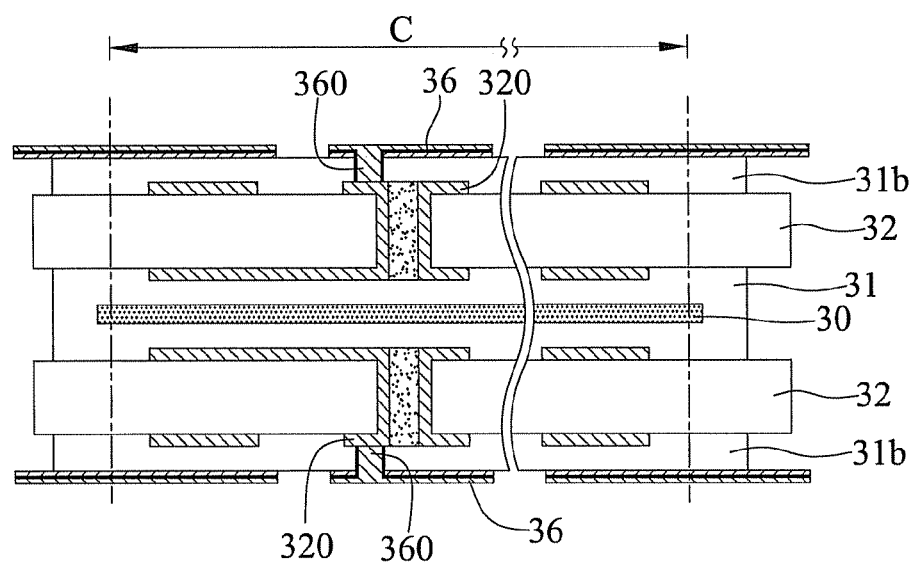

Referring to FIG. 4B, an inner wiring layer 36 is formed by the metal layer 36a by patterning process, and the inner wiring layer 36 has one or more inner conductive vias 360 disposed in the second auxiliary dielectric layer 31b to electrically connect to the inner-layer conductive traces 320. Various techniques for fabricating wiring layers and vias are known in the art, and, in that those techniques are not the technical feature of the present invention, no further description regarding those techniques is provided herein.

Figure 4C:
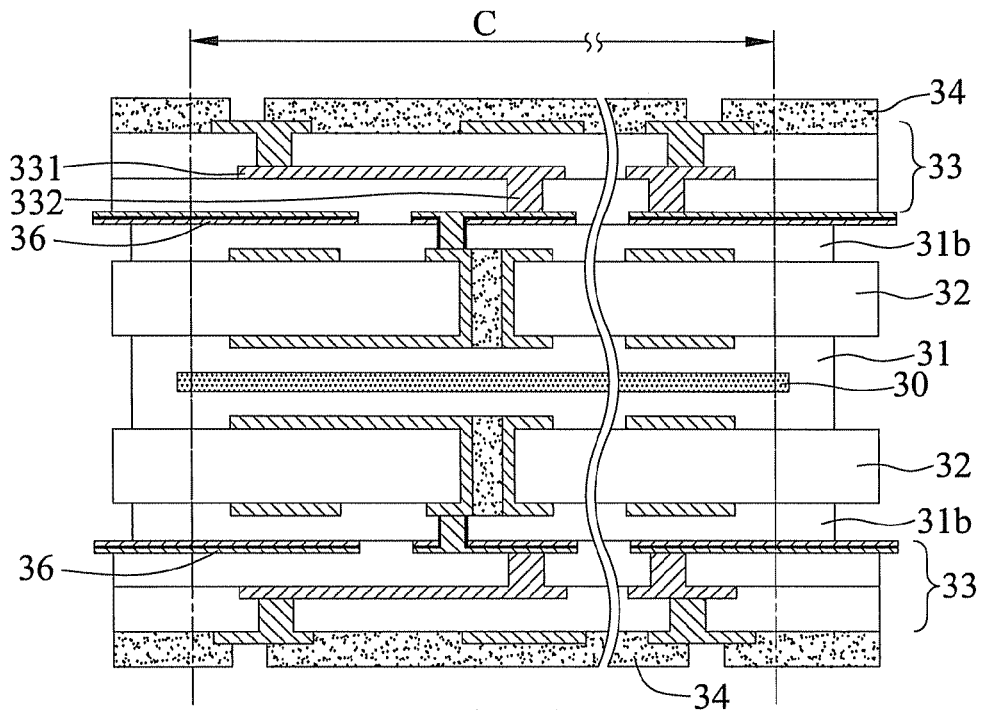

Referring to FIG. 4C, a built-up structure 33 is formed on the second auxiliary dielectric layer 31b and the inner wiring layer 36, wherein one or more conductive vias 332 electrically connect the wiring layer 331 and the inner wiring layer 36.

Figure 4D:
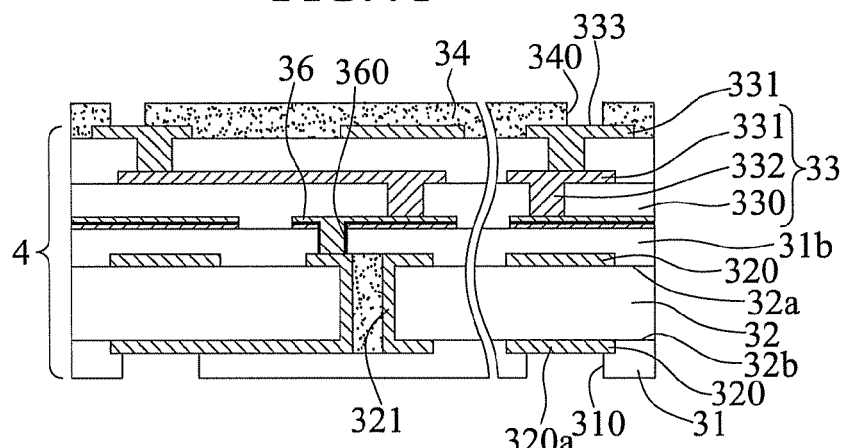
Figure 4E:
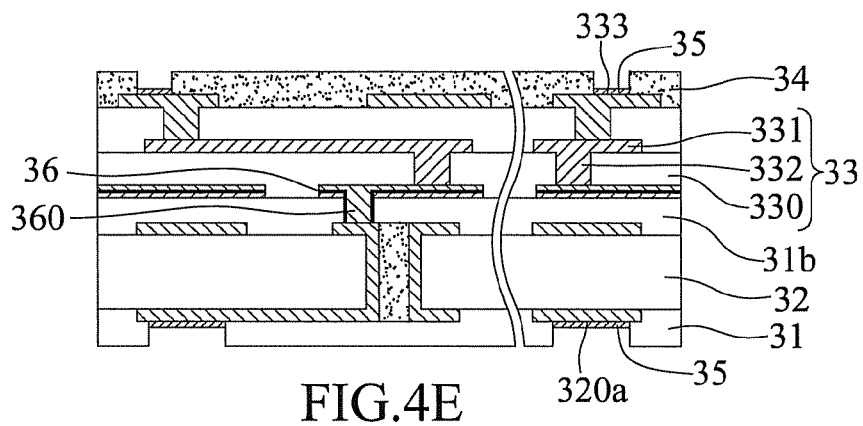

Referring to FIGS. 4D and 4E, in order to complete fabrication of the substrate body, additional steps include: first, removing the structure outside of the effective area C using a cutting manner, then removing the release film 30, and subsequently forming a plurality of dielectric layer openings 310 in the first auxiliary dielectric layer 31, such that the second conductive pads 320a are exposed from the dielectric layer openings 310, respectively, thereby forming the substrate body 4, as shown in FIG. 4D. In a subsequent process, a surface treatment layer 35 can also be formed on the first and second conductive pads 333, 320a, as shown in FIG. 4E, so as to obtain a thin-cored whole-panel packaging substrate.

The present invention discloses using the first auxiliary dielectric layer 31 to enclose the release film 30 for disposing two core plates 32 oppositely on the first auxiliary dielectric layer 31, wherein the metal layer 36a on the core plate 32 can become an inner wiring layer 36 by a patterning process, such that only the release film 30 has to be removed and discarded in order to effectively avoid the problems of material waste and process complexity otherwise resulting from discarding the temporary carrier as is the case in the prior art.

The above-described descriptions of the specific embodiments are intended to illustrate the preferred implementation according to the present invention but are not intended to limit the scope of the present invention, Accordingly, modifications and variations carried out in accordance with the specific embodiments by persons ordinarily skilled in the art fall within the scope of present invention as defined by the appended claims.

What is claimed is:

1. A method for fabricating a packaging substrate, comprising the steps of:
  providing a base including a release film having two opposite surfaces, two first auxiliary dielectric layers correspondingly disposed on the opposite surfaces of the release film and enclosing the release film, and two metal layers disposed on the two first auxiliary dielectric layers, respectively, therewith an effective area defined on each of the two metal layers;
  forming an inner wiring layer on each of the two metal layers;
  forming a built-up structure on each of the two first auxiliary dielectric layers and the inner wiring layers, wherein the outermost surfaces of the built-up structures have a plurality of first conductive pads for two initial substrates to be formed on the two opposite surfaces of the release film;
  removing whatever is otherwise lying outside the effective area;
  removing the release film; and
  forming a plurality of dielectric layer openings in the two first auxiliary dielectric layers so as for two substrate bodies to be formed from the initial substrates, wherein a portion of the inner wiring layers correspond in position to and are exposed from the dielectric layer openings, respectively, thereby to function as second conductive pads.

2. The method for fabricating a packaging substrate of claim 1, wherein the method of making the base comprises the steps of:
  providing the release film;
  disposing the first auxiliary dielectric layers and the metal layers on the two opposite surfaces of the release film in sequence, wherein each of the first auxiliary dielectric layers is larger in area than the release film, and each of the metal layers is larger in area than the first auxiliary dielectric layer; and
  laminating the metal layers, the first auxiliary dielectric layers, and the release film together.

3. The method for fabricating a packaging substrate of claim 1, wherein the built-up structure has at least one dielectric layer, a wiring layer disposed on the dielectric layer, and one or more conductive vias disposed in the dielectric layer and electrically connecting the wiring layer and the inner wiring layer, and the outermost wiring layer electrically connects with the plurality of first conductive pads.

4. The method for fabricating a packaging substrate of claim 1, wherein the removal of whatever is otherwise lying outside the effective area is preformed by cutting.

5. The method for fabricating a packaging substrate of claim 1, further comprising forming an insulating protective layer on the built-up structure, the insulating protective layer having a plurality of insulating protective layer openings formed therein, such that the first conductive pads are exposed from the insulating protective layer openings, respectively.

6. The method for fabricating a packaging substrate of claim 5, further comprising forming a surface treatment layer on the plurality of first conductive pads and the second conductive pads.

7. A method for fabricating a packaging substrate, comprising the steps of:
  providing a base comprising a release film having two opposite surfaces, two first auxiliary dielectric layers correspondingly disposed on the opposite surfaces of the release film and enclosing the release film, and two core plates disposed on the two first auxiliary dielectric layers, respectively, each of the core plates having opposite first and second surfaces on which inner-layer conductive traces are disposed, wherein the second surface of each of the core plates is coupled to the first auxiliary dielectric layer, and effective areas are defined on the first surfaces of each of the core plates;
  forming a built-up structure on the first surface of each of the core plates such that two initial substrates are formed on the two opposite surfaces of the release film, wherein the outermost surface of each of the built-up structures has a plurality of first conductive pads;
  removing whatever is otherwise lying outside the effective area;
  removing the release film; and
  forming a plurality of dielectric layer openings in the two first auxiliary dielectric layers so as for two substrate bodies to be formed from the initial substrates, wherein a portion of the inner-layer conductive traces on the second surfaces of the core plates correspond in position to and are exposed from the dielectric layer openings, respectively, thereby to function as second conductive pads.

8. The method for fabricating a packaging substrate of claim 7, wherein the method of making the base comprises the steps of:
provmg the release film;
disposing the first auxiliary dielectric layers and the core plates on the two opposite surfaces of the release film in sequence, wherein the first auxiliary dielectric layer is larger in area than the release film, and each of the core plates is larger in area than of the first auxiliary dielectric layer such that each of the core plates totally covers the first auxiliary dielectric layer; and
laminating the core plates, the first auxiliary dielectric layers, and the release film together.

9. The method for fabricating a packaging substrate of claim 7, wherein the core plate further has one or more conductive through holes therein for electrically connecting the inner-layer conductive traces on the first and second surfaces.

10. The method for fabricating a packaging substrate of claim 7, wherein the built-up structure has at least one dielectric layer, a wiring layer disposed on the dielectric layer, and one or more conductive vias disposed in the dielectric layer to electrically connect the wiring layer and the inner-layer conductive traces, and the outmost wiring layer is electrically connected to the first conductive pads.

11. The method for fabricating a packaging substrate of claim 7, wherein the removal of whatever is otherwise lying outside the effective area is preformed by cutting.

12. The method for fabricating a packaging substrate of claim 7, further comprising forming an insulating protective layer on the built-up structure, the insulating protective layer having a plurality of insulating protective layer openings formed therein, such that the first conductive pads are exposed from the insulating protective layer openings, respectively.

13. The method for fabricating a packaging substrate of claim 12, further comprising forming a surface treatment layer on the first conductive pads and the second conductive pads.

14. The method for fabricating a packaging substrate of claim 7, wherein the base further has two second auxiliary dielectric layers disposed on the core plates and two metal layer disposed on the two second auxiliary dielectric layers.

15. The method for fabricating a packaging substrate of claim 14, wherein the method of making the base comprises the steps of:
providing the release film;
disposing the first auxiliary dielectric layers, the core plates, the second auxiliary dielectric layers, and the metal layers on the two opposite surfaces of the release film in sequence, wherein each of the first auxiliary dielectric layers is larger in area than the release film, each of the core plates is larger in area than the first auxiliary dielectric layer, and each of the metal layers is larger in area than the second auxiliary dielectric layer and the core plate, such that the metal layer totally covers the second auxiliary dielectric layer and the core plate; and
laminating the core plates, the metal layers, the first auxiliary dielectric layers, the second auxiliary dielectric layers, and the release film together.

16. The method for fabricating a packaging substrate of claim 14, further comprising forming an inner wiring layer from the metal layer such that the built-up structure is disposed on the second auxiliary dielectric layer and the inner wiring layer, wherein the inner wiring layer has one or more inner conductive vias located in the second auxiliary dielectric layer for electrically connecting the inner-layer conductive traces.

17. The method for fabricating a packaging substrate of claim 16, wherein the built-up structure has at least one dielectric layer, a wiring layer disposed on the dielectric layer, and one or more conductive vias disposed in the dielectric layer to electrically connect the wiring layer and the inner wiring layer, the first conductive pads electrically connecting with the outmost wiring layer, therewith an insulating protective layer formed on the built-up structure, the insulating protective layer having a plurality of insulating protective layer openings formed therein such that the first conductive pads are exposed from the insulating protective layer openings, respectively.

* * * * *